US009966561B2

(12) United States Patent
Kim et al.

(10) Patent No.: US 9,966,561 B2
(45) Date of Patent: May 8, 2018

(54) DISPLAY DEVICE HAVING A PLURALITY OF PARTICLES BETWEEN INORGANIC LAYERS AND METHOD OF MANUFACTURING THE SAME

(71) Applicant: SAMSUNG DISPLAY CO., LTD., Yongin-si, Gyeonggi-do (KR)

(72) Inventors: Seongjun Kim, Yongin-si (KR); Jaehyun Kim, Yongin-si (KR); Shogo Nishizaki, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days. days.

(21) Appl. No.: 15/230,160

(22) Filed: Aug. 5, 2016

(65) Prior Publication Data

US 2017/0133630 A1    May 11, 2017

(30) Foreign Application Priority Data

Nov. 11, 2015   (KR) ........................ 10-2015-0158104

(51) Int. Cl.
*H01L 51/52*   (2006.01)
*H01L 51/56*   (2006.01)

(52) U.S. Cl.
CPC ...... *H01L 51/5246* (2013.01); *H01L 51/5218* (2013.01); *H01L 51/5234* (2013.01); *H01L 51/5256* (2013.01); *H01L 51/5259* (2013.01); *H01L 51/56* (2013.01); *H01L 2227/323* (2013.01)

(58) Field of Classification Search
CPC ............. H01L 51/5259; H01L 51/5218; H01L 51/5234; H01L 51/5246; H01L 51/56; H01L 51/5256
See application file for complete search history.

(56) References Cited

U.S. PATENT DOCUMENTS

| | | | |
|---|---|---|---|
| 2009/0058268 A1 | 3/2009 | Yoshida et al. | |
| 2011/0100458 A1 | 5/2011 | Kang et al. | |
| 2012/0241811 A1 | 9/2012 | Kim et al. | |
| 2014/0183462 A1 | 7/2014 | Lee et al. | |
| 2016/0064503 A1* | 3/2016 | Yun ................... | H01L 31/02327 257/40 |

FOREIGN PATENT DOCUMENTS

| | | |
|---|---|---|
| JP | 2014-167893 A | 9/2014 |
| KR | 10-2008-0053439 A | 6/2008 |
| KR | 10-2012-0109083 A | 10/2012 |
| KR | 10-2014-0088335 A | 7/2014 |

* cited by examiner

*Primary Examiner* — Alonzo Chambliss

(74) *Attorney, Agent, or Firm* — Lewis Roca Rothgerber Christie LLP

(57) ABSTRACT

A display device includes a substrate, a display unit on the substrate, and an encapsulating unit configured to seal the display unit from external moisture or oxygen and including an organic layer and an inorganic layer. The inorganic layer includes a first layer, a second layer on the first layer, and one or more first particles between the first and second layers. A method of manufacturing a display device includes forming a display unit on a substrate and sealing the display unit from external moisture or oxygen by forming an encapsulating unit. The forming of the encapsulating unit includes forming an inorganic layer. The forming of the inorganic layer includes forming a first layer, forming one or more first particles on an upper surface of the first layer, and forming a second layer on the first layer and the first particles.

14 Claims, 10 Drawing Sheets

DISPLAY DEVICE HAVING A PLURALITY OF PARTICLES BETWEEN INORGANIC LAYERS AND METHOD OF MANUFACTURING THE SAME

CROSS-REFERENCE TO RELATED APPLICATION

This application claims priority to and the benefit of Korean Patent Application No. 10-2015-0158104, filed on Nov. 11, 2015 in the Korean Intellectual Property Office, the entire content of which is herein incorporated by reference.

BACKGROUND

1. Field

Aspects of embodiments of the present invention relate to a display device and a method of manufacturing the display device.

2. Description of the Related Art

Displays connect media between users and information. The display market increases as information technology develops. Accordingly, utilization of display devices such as liquid crystal displays (LCDs), organic light-emitting diode (OLED) displays, electrophoretic displays (EPDs), and plasma display panels (PDPs) increases. Recently, demand for display panels has expanded not only for flat display panels, but also for flexible display panels capable of folding in various directions. However, flexible display devices may have low lateral visibility, white angular dependency (WAD), and luminescent efficiency as emitted light may only project or emit outward (e.g., from the display surface) and not from lateral surfaces.

SUMMARY

Aspects of embodiments of the present invention provide for a display device that has improved lateral visibility, WAD, and luminescent efficiency by scattering projected or emitted light using an encapsulating unit, and a method of manufacturing the display device. Additional aspects will be set forth in part in the description that follows and, in part, will be apparent from the description, or may be learned by practice of the presented embodiments.

According to an embodiment of the present invention, a display device is provided. The display device includes a substrate, a display unit on the substrate, and an encapsulating unit configured to seal the display unit from external moisture or oxygen and including an organic layer and an inorganic layer. The inorganic layer includes a first layer, a second layer on the first layer, and one or more first particles between the first and second layers.

An upper surface of the second layer may have one or more first projecting portions corresponding to the one or more first particles.

The one or more first particles may include two or more first particles. The one or more first projecting portions may include two or more first projecting portions corresponding to the two or more first particles.

The inorganic layer may further include a third layer on the second layer.

The inorganic layer may further include one or more second particles between the second and third layers. An upper surface of the third layer may have second projecting portions corresponding to the first and second particles.

According to another embodiment of the present invention, a method of manufacturing a display device is provided. The method includes forming a display unit on a substrate, and sealing the display unit from external moisture or oxygen by forming an encapsulating unit. The forming of the encapsulating unit includes forming an inorganic layer. The forming of the inorganic layer includes forming a first layer using a first process, forming one or more first particles on an upper surface of the first layer using a second process, and forming a second layer on the first layer and the first particles using a third process.

The third process may be the same process as the first process.

The second process may be a different process from the first and third processes.

The second process may differ in a supply of power from the first and third processes.

The first and third processes may include supplying a plurality of reaction gases to form the first and second layers. The second process may include not supplying at least one of the reaction gases.

The first process, the second process, and the third process may be continuously performed.

The forming of the second layer may include forming one or more first projecting portions on an upper surface of the second layer corresponding to the one or more first particles.

The forming of the inorganic layer may further include forming a third layer on the second layer.

The forming of the inorganic layer may further include forming one or more second particles on an upper surface of the second layer. The forming of the third layer may further include forming the third layer on the second particles.

The forming of the encapsulating unit may further include forming an organic layer.

BRIEF DESCRIPTION OF THE DRAWINGS

These and other aspects of the present invention will become more apparent and more readily appreciated from the following description of example embodiments, taken in conjunction with the accompanying drawings in which.

DETAILED DESCRIPTION

Figure 1:
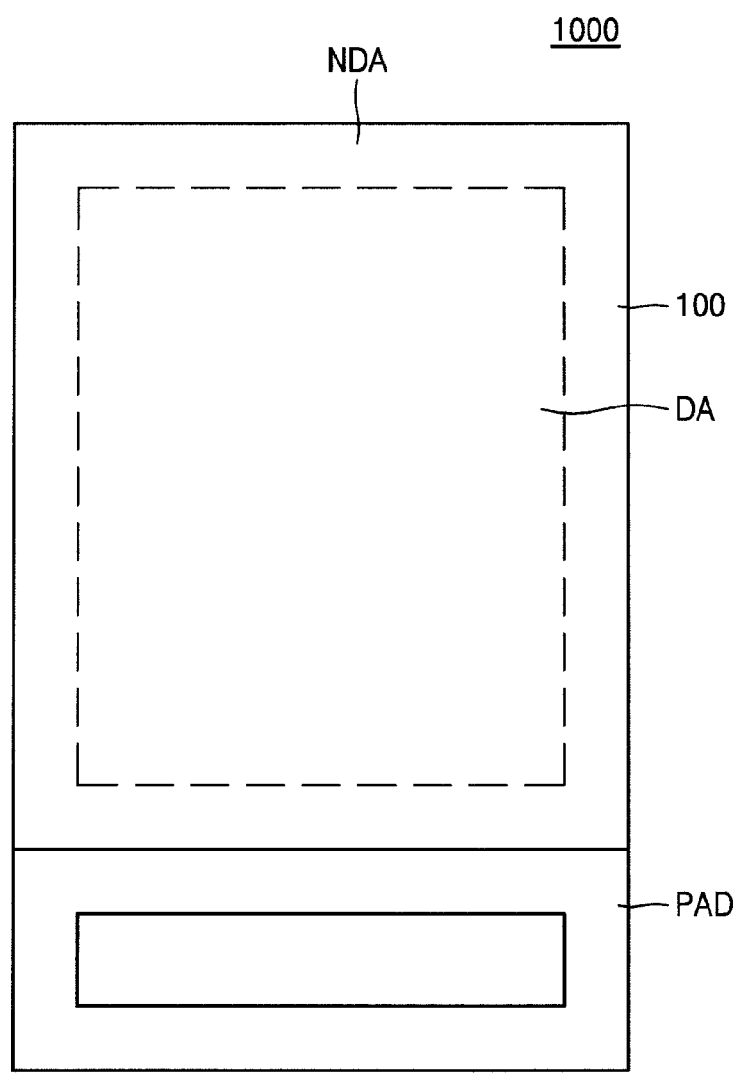
FIG. 1 is a plan view of an example display device according to an embodiment of the present invention.

Reference will now be made in detail to embodiments of the present invention, examples of which are illustrated in the accompanying drawings, wherein like reference numerals refer to like elements throughout. In this regard, the present invention may have different forms and should not be construed as being limited to the embodiments set forth herein. Accordingly, embodiments are described below, with reference to the figures, to explain aspects of the present invention. As used herein, the term "and/or" includes any and all combinations of one or more of the associated listed items. Expressions such as "at least one of," when preceding a list of elements, modify the entire list of elements and do not modify the individual elements of the list.

Embodiments of the present invention are described below in detail with reference to the accompanying drawings. The same or similar reference numerals are used to denote the same or similar elements, and repeated descriptions thereof may be omitted. It will be understood that although the terms "first", "second", etc., may be used herein to describe various components, these components should not be limited by these terms. These terms are used primarily to distinguish one component from another, and are used sometimes in an ordinal sense as would be apparent to one of ordinary skill.

An expression used in the singular encompasses the expression of the plural, unless it has a clearly different meaning in the context. It will be further understood that the term "comprises" and variations such as "comprising" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of elements in the drawings may be exaggerated for convenience of explanation. For example, sizes and thicknesses of components in the drawings may be arbitrarily illustrated for convenience of explanation. However, the present invention is not limited to these sizes, thicknesses, etc.

Unless clearly apparent from the context, a specific process order in one embodiment may be performed differently from the described order in another embodiment. For example, two consecutively described process steps in one embodiment may be performed substantially at the same time or performed in an order opposite to the described order in other embodiments.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

FIG. 1 is a plan view of an example display device 1000 according to an embodiment of the present invention.

The display device 1000 may include a substrate 100, such as a flexible substrate 100. For example, the substrate 100 may be formed of various materials with flexibility and may be formed of plastic materials with good heat-resistance and durability as would be apparent to one of ordinary skill in the art.

The substrate 100 may include a display area DA for displaying images that a user may view or observe, and a non-display area NDA that is an area outside the display area DA and is not for displaying images to the user. The display area DA may include various light-generating elements, such as organic light emitting elements or liquid crystal display elements, and voltage lines supplying electrical power to the display area DA may be arranged in the non-display area NDA.

In addition, a pad unit (PAD), which may transfer electrical signals from a power supply or a signal generating device to the display area DA, may be arranged in the non-display area NDA. The pad unit may include a driver IC (integrated circuit), a pad connecting the driver IC and pixel circuits, and fan-out wiring.

Figure 2:
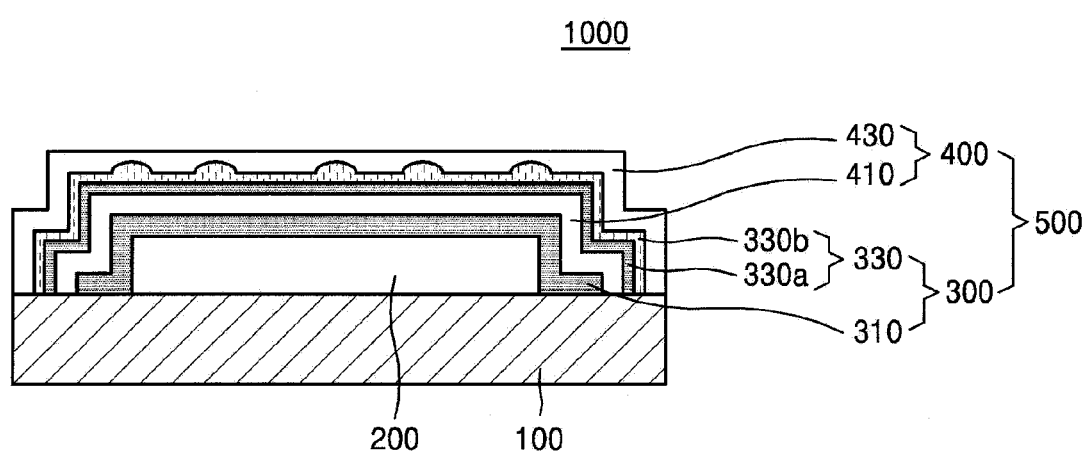
FIG. 2 is an example schematic cross-sectional view of the display device illustrated in FIG. 1 according to an embodiment of the present invention.

FIG. 2 is an example schematic cross-sectional view of the display device 1000 illustrated in FIG. 1 according to an embodiment of the present invention.

The display device 1000 may include the substrate 100, a display unit 200 on the substrate 100, and an encapsulating unit 500 to protect the display unit 200 from external moisture or oxygen. The substrate 100 may include various materials as described above. In other embodiments, the substrate 100 may be formed of transparent glass materials having $SiO_2$ as a main component. However, the present invention is not limited thereto, and in still other embodiments, the substrate 100 may be formed of transparent plastic materials. For example, these plastic materials may include one or more organic materials selected from a group consisting of insulating organic materials such as polyethersulphone (PES), polyacrylate (PAR), polyetherimide (PEI), polyethylene napthalate (PEN), polyethylene terephthalate (PET), polyphenylene sulfide (PPS), polyacrylate, polyimide, polycarbonate (PC), cellulose triacetate (TAC), and cellulose acetate propionate (CAP).

The display device 1000 may include the substrate 100 having a flexible property and thus, may bend or curve from primarily a two dimensional shape to a more three dimensional shape according to one or more embodiments. According to one or more embodiments, the substrate 100 may be formed of materials having a Poisson's ratio of about 0.4 or more. The Poisson's ratio denotes the ratio of transverse contraction strain to longitudinal extension strain in the direction of stretching force. The flexibility of the substrate 100 may be enhanced and accordingly, the display device 1000 may be easily bendable or foldable by ensuring that materials forming the substrate 100 have a Poisson's ratio of about 0.4 or more. For example, the substrate 100 may have a good stretching property.

The display unit 200 may be disposed on the substrate 100. The display unit 200 may emit visible light so that a user may view images thereon. The display unit 200 may include various elements such as displaying elements, for example, organic light-emitting diodes (OLEDs), liquid crystal display elements, etc. For example, the display unit 200 of the display device 1000 may include OLEDs according to one or more embodiments, and a detailed description will be provided below.

The display device 1000 may include the encapsulating unit 500 encapsulating (for example, completely encapsulating) the display unit 200 to seal and protect the display unit 200 from external moisture or oxygen according to one or more embodiments. According to one or more embodiments, the encapsulating unit 500 may be formed on the display unit 200, and both ends of the encapsulating unit 500 may adhere to the substrate 100. According to one or more embodiments, the encapsulating unit 500 may be a stack including a plurality of thin film layers, wherein an inorganic layer 300 and an organic layer 400 are alternately laminated.

For example, as illustrated in FIG. 2, a first inorganic layer 310, a first organic layer 410, a second inorganic layer 330, and a second organic layer 430 are sequentially laminated to form the encapsulating unit 500. However, the number of thin film layers is not limited thereto, and in other embodiments, a plurality of even more thin film layers may be alternately laminated.

The inorganic layer 300 may, for example, solidly block oxygen or water penetration, and the organic layer 400 may absorb stress of the inorganic layer 300 to provide flexibility to the encapsulating unit 500. The inorganic layer 300 may be a single layer or a laminated layer or multilayer including a metal oxide or a metal nitride. According to one or more embodiments, the inorganic layers may include any one or more of SiNx, $Al_2O_3$, $SiO_2$, and $TiO_2$.

The organic layer 400, on the other hand, may be formed of a polymer, and may be, for example, a single layer or a laminated layer or multilayer formed of any one or more of polyethylene terephthalate (PET), polyimide, polycarbonate (PC), epoxy, polyethylene, and polyacrylate (PAR). For example, the organic layers may be polyacrylate (PAR). In further detail, the organic layers may include a polymerized monomer composition including diacrylate monomer and triacrylate monomer. The monomer composition may further include a monoacrylate-based monomer. The monomer composition may further include a photoinitiator such as a TPO but is not limited thereto.

According to one or more embodiments, the inorganic layer 300 may include a multilayer film. However, the inorganic layer 300 is not limited thereto. For example, in other embodiments, one or both of the first and second inorganic layers 310 and 330 may include a multilayer film. As illustrated in FIG. 2, the second inorganic layer 330 in the display device 1000 may include two layers. For example, the second inorganic layer 330 may include a first layer 330a and a second layer 330b on the first layer 330a.

According to one or more embodiments, an upper surface of the second layer 330b may be uneven and partially swollen. The partially swollen upper surface of the second layer 330b may change a projecting or emitting path of light and therefore, luminescent efficiency may be improved. A structure of an inorganic layer including a multilayer film will be described below with reference to FIG. 3.

Figure 3:
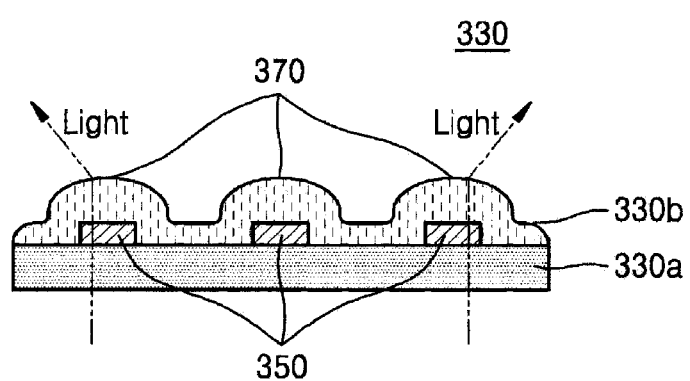
FIG. 3 is a cross-sectional view of an example second inorganic layer illustrated in FIG. 2 according to an embodiment of the present invention.

FIG. 3 is a cross-sectional view of an example second inorganic layer 330 illustrated in FIG. 2 according to an embodiment of the present invention.

The second inorganic layer 330 may include the first and second layers 330a and 330b, and one or more particles 350 on a boundary surface of the first and second layers 330a and 330b according to one or more embodiments. The number of particles 350 may be one or more, and the size and position of the particles 350 may also vary. For the sake of convenience, the particles 350 have a square shape in FIG. 3 for improving visibility. However, the particles 350 may be formed in various shapes and sizes (such as smaller) in other embodiments.

The particles 350 may be formed of the same inorganic material as that of the first and second layers 330a and 330b. In more detail, the particles 350 may include metal oxides or metal nitrides. According to one or more embodiments, the particles 350 may include any one or more of SiNx, $Al_2O_3$, $SiO_2$, and $TiO_2$. A process of forming the particles 350 will be described in further detail below with reference to the drawings according to one or more embodiments of a method of manufacturing a display device.

After the particles 350 are formed on the first layer 330a, the second layer 330b may be formed on the first layer 330a and cover the particles 350. An upper surface of the second layer 330b may include one or more projecting portions 370 (for example, corresponding to the one or more particles 350). For example, the upper surface of the second layer 330b may be uneven and partially project upward as described above.

According to one or more embodiments, the projecting portions 370 may be formed on the upper surface of the second layer 330b around the particles 350. When the particles 350 are wholly or partially on the upper surface of the first layer 330a, then the second layer 330b (which is formed on the first layer 330a and the particles 350) may be formed by using the particles 350 as seeds. Therefore, a surface of the second layer 330b may not be even (for example, the surface of the second layer 330b may be uneven). For example, parts of the second inorganic layer 330 where the particles 350 are located may have the projecting portions 370 in which the upper surface of the second layer 330b partially projects upward.

As described above, a part of the inorganic layer (such as the inorganic layer 300 of FIG. 2) may include a multilayer film and an upper surface of a top layer of the multilayer film on the particles 350 may have curves due to the particles 350 provided between layers of the multilayer film. Therefore, a projecting or emitting path of light may change.

By contrast, when an upper surface of an inorganic layer is formed evenly, light only projects or emits in a linear or straight direction (such as perpendicular to the display unit). Therefore, luminescent efficiency and lateral visibility may be reduced.

According to one or more embodiments, the display device (such as the display device 1000 of FIG. 2) may include the first and second layers 330a and 330b in the second inorganic layer 330, and may further include the projecting portions 370 in which the upper surface of the second layer 330b is curved due to the particles 350 between the first and second layers 330a and 330b. Therefore, a projecting or emitting path of light may change.

According to one or more embodiments, as illustrated in FIG. 3, light may project or emit in a linear or straight direction and then turn or refract by the projecting portions 370. Therefore, lateral visibility (WAD) and luminescent efficiency may be improved.

For convenience of description, FIG. 3 illustrates a couple of projecting or emitting paths of light. However, the projecting or emitting light in general may be refracted in various and numerous angles and exit from the display device 1000. The second layer 330b including the projecting portions 370 may be a light scattering layer and luminescent efficiency may be improved due to light scattering in the encapsulating unit (such as the encapsulating unit 500 of FIG. 2).

Figure 4:
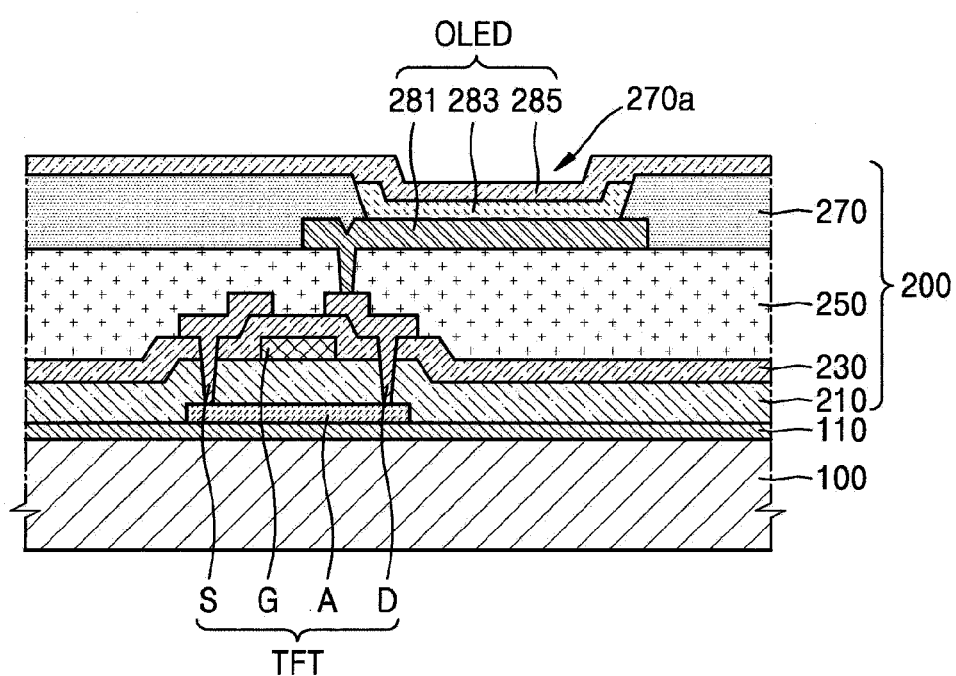
FIG. 4 is a schematic cross-sectional view of an example display unit of the display device illustrated in FIG. 2 according to an embodiment of the present invention.

FIG. 4 is a schematic cross-sectional view of an example display unit 200 of the display device 1000 illustrated in FIG. 2 according to an embodiment of the present invention. The display unit 200, as described above, may include various light emitting or image forming elements such as OLEDs or liquid crystal display elements; however, an embodiment in which the display unit 200 includes OLEDs will be described below for the sake of convenience.

A buffer layer 110 may be formed on the substrate 100. The buffer layer 110 may reduce or prevent dispersion of impurity ions, reduce or prevent invasion of moisture or external air, and function as a barrier layer or a blocking layer as well as a planarizing layer to flatten a surface of the substrate 100. The buffer layer 110 may include an inorganic layer and be arranged on the entire surface of the substrate 100.

A thin film transistor (TFT) may be arranged on the buffer layer 110. An active layer A of the TFT may be formed of polysilicon and may include an undoped channel region, and a source region and a drain region respectively formed on opposite sides of the channel region and doped with impurities. The impurities may vary depending on a kind of the TFT and may include n-type impurities or p-type impurities.

A gate insulating layer 210 may be formed on the active layer A after the active layer A has been formed. The gate insulating layer 210 may include inorganic materials such as silicon oxides and silicon nitrides, and may include a single layer or multiple layers. The gate insulating layer 210 may play a role of insulating the active layer A from a gate electrode G arranged on the gate insulating layer 210. The gate insulating layer 210 may include an inorganic layer and be arranged on the entire surface of the substrate 100.

The gate electrode G may be formed on the gate insulating layer 210 after the gate insulating layer 210 has been formed. The gate electrode G may be formed, for example, via a photolithography process and an etching process. Materials for the gate electrode G may include at least one of metals selected from Mo, Al, Pt, Pd, Ag, Mg, Au, Ni, Nd, Ir, Cr, Li, Ca, Ti, W, and Cu.

An interlayer insulating layer 230 may be formed on the entire surface of the substrate 100 and cover the gate electrode G after the gate electrode G has been formed. The interlayer insulating layer 230 may include inorganic materials. For example, the interlayer insulating layer 230 may be made up of metal oxides or metal nitrides, and in further detail, the inorganic materials may include one or more of $SiO_2$, SiNx, SiON, $Al_2O_3$, $TiO_2$, $Ta_2O_5$, $HfO_2$, and $ZrO_2$.

The interlayer insulating layer 230 may be formed of inorganic materials such as silicon oxides (SiOx) or silicon nitrides (SiNx), and may include a single layer or multiple layers. In some embodiments, the interlayer insulating layer 230 may be configured to have a dual structure of SiOx/SiNy or SiNx/SiOy.

A source electrode S and a drain electrode D of the TFT may be arranged on the interlayer insulating layer 230. The source electrode S and the drain electrode D may include at least one of metals selected from Al, Pt, Pd, Ag, Mg, Au, Ni, Nd, Ir, Cr, Li, Ca, Mo, Ti, W, and Cu.

A via layer 250 may be configured to cover the source electrode S and the drain electrode D. A first electrode 281 may be formed on the via layer 250. The first electrode 281 may be connected to the drain electrode D through a via hole as illustrated in FIG. 4.

The via layer 250 may be formed of insulating materials. For example, the via layer 250 may include inorganic materials, organic materials, or a combination of organic/inorganic materials, have a structure of a single layer or a multilayer, and be formed via various deposition methods as would be apparent to one of ordinary skill in the art. In some embodiments, the via layer 250 may include at least one of polyacrylate resin, epoxy resin, phenolic resin, polyamide resin, polyimide resin, unsaturated polyester resin, polyphenylene resin, polyphenylene sulfide resin, and benzocyclobutene (BCB).

An OLED may be arranged on the via layer 250. The OLED may include the first electrode 281, an intermediate layer 283 including an organic light emitting layer, and a second electrode 285. In addition, the display device 1000 may further include a pixel-defining layer 270 on the via layer 250 and the first electrode 281. The pixel-defining layer 270 may have an opening 270a corresponding to the OLED (e.g., partially exposing the first electrode 281).

Holes and electrons injected from the first electrode 281 and the second electrode 285 of the OLED may combine in the organic light emitting layer of the intermediate layer 283 and generate light. The first electrode 281 and the second electrode 285 may be provided as a transparent electrode or a reflective electrode. For example, one of the first electrode 281 and the second electrode 285 may be a transparent electrode, and the other one of the first electrode 281 and the second electrode 285 may be a reflective electrode.

When one of the first and second electrodes 281 and 285 is a transparent electrode, the transparent electrode may include one or more of ITO, IZO, ZnO, and $In_2O_3$. When one of the first and second electrodes 281 and 285 is a reflective electrode, the reflective electrode may include a reflective layer formed of Ag, Mg, Al, Pt, Pd, Au, Ni, Nd, Ir, Cr, or an alloy of these metals, and a transparent layer formed of one or more of ITO, IZO, ZnO, and $In_2O_3$. For example, in some embodiments, one of the first electrode 281 and the second electrode 285 may have a structure of ITO/Ag/ITO.

The intermediate layer 283 may be formed between the first electrode 281 and the second electrode 285, and may include the organic light emitting layer. According to one or more embodiments, the intermediate layer 283 may include the organic light emitting layer and may further include at least one of a hole injection layer (HIL), a hole transport layer, an electron transport layer, and an electron injection layer. However, the present invention is not limited thereto, and in other embodiments, the intermediate layer 283 may include the organic light emitting layer and further include other various functional layers.

One or more spacers may be further formed on the pixel-defining layer 270. The spacers may project upward from the pixel-defining layer 270 and may be provided to reduce or prevent degradation of display characteristics due to external impacts.

Figure 5:
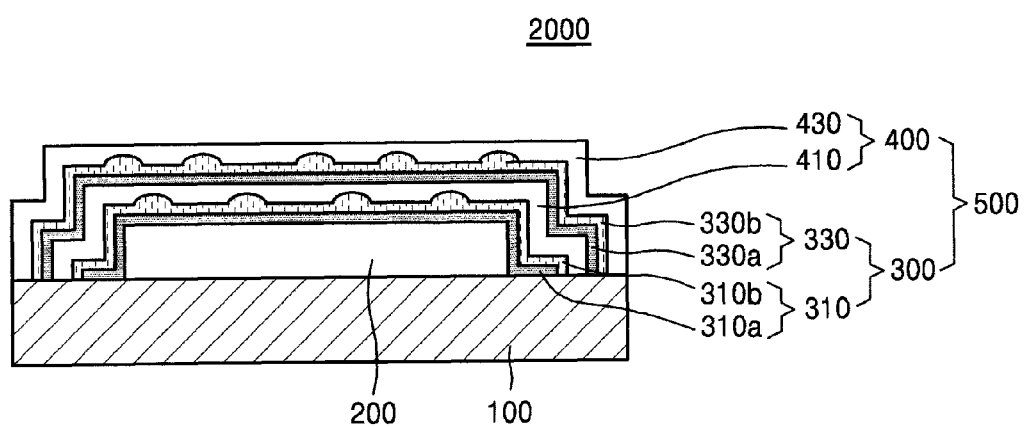
FIG. 5 is a schematic sectional view of an example display device according to another embodiment of the present invention.

FIG. 5 is a schematic sectional view of an example display device 2000 according to another embodiment of the present invention. In FIG. 5, like reference numerals to those of FIG. 2 denote like elements, and repeated descriptions thereof may be omitted for simplicity.

The display device 2000 may include the substrate 100, the display unit 200 on the substrate 100, and an encapsulating unit 500 configured to encapsulate the display unit 200 and to block or seal the display unit 200 from external moisture or oxygen.

According to one or more embodiments, the encapsulating unit 500 may be formed on the display unit 200, and both ends of the encapsulating unit 500 may adhere to the substrate 100. According to one or more embodiments, the encapsulating unit 500 may be a stack including a plurality of thin film layers, in which an inorganic layer 300 and an organic layer 400 are alternately laminated.

According to one or more embodiments, as illustrated in FIG. 5, a first inorganic layer 310, a first organic layer 410, a second inorganic layer 330, and a second organic layer 430 may be sequentially laminated to form the encapsulating unit 500. However, the number of thin film layers is not limited thereto and in other embodiments, a plurality of even more thin film layers may be alternately laminated. The inorganic layer 300 may solidly block oxygen or water penetration, and the organic layer 400 may absorb stress of the inorganic layer 300 to provide flexibility to the encapsulating unit 500. According to one or more embodiments, the first and second inorganic layers 310 and 330 may each include a multilayer film.

FIG. 5 illustrates the inorganic layer 300 including the first and second inorganic layers 310 and 330. However, the inorganic layer 300 is not limited thereto and in other embodiments, may include three or more inorganic layers.

In addition, according to one or more embodiments, all inorganic layers may include a multilayer film. According to other embodiments, only some inorganic layers may include a multilayer film.

The first and second inorganic layers 310 and 330 may include respective first layers 310a and 330a, and respective second layers 310b and 330b. As illustrated in FIGS. 3 and 5, the particles 350 may be formed between the first and second layers 310a and 310b, and between the first and second layers 330a and 330b. For the sake of illustration, even though smaller particles 350 are not shown in FIG. 5, the number, size, and position of the particles 350 between the first and second layers 310a and 310b, and between the first and second layers 330a and 330b, may vary.

The upper surfaces of the second layers 310b and 330b may be uneven due to the particles (such as the particles 350 of FIG. 3) between the first and second layers 310a and 310b, and between the first and second layers 330a and 330b. For example, the display device 2000 may include projecting portions (such as the projecting portions 370 of FIG. 3) in positions where the particles 350 are located at the upper surface of the second layer 310b of the first inorganic layer 310 and the second layer 330b of the second inorganic layer 330.

According to one or more embodiments, the upper surface of the second layer 310b of the first inorganic layer 310 and the second layer 330b of the second inorganic layer 330 may include the projecting portions 370 in positions corresponding to the particles 350. Therefore, a projecting or emitting path of light generated from the display unit 200 may be changed due to the projecting portions 370 on the upper surfaces of the second layers 310b and 330b. As a result, as light is refracted and dispersed by passing through the second layer 310b of the first inorganic layer 310 and the second layer 330b of the second inorganic layer 330, the display device 2000 may ensure a wide viewing angle and improve luminescent efficiency according to one or more embodiments.

Figure 6:
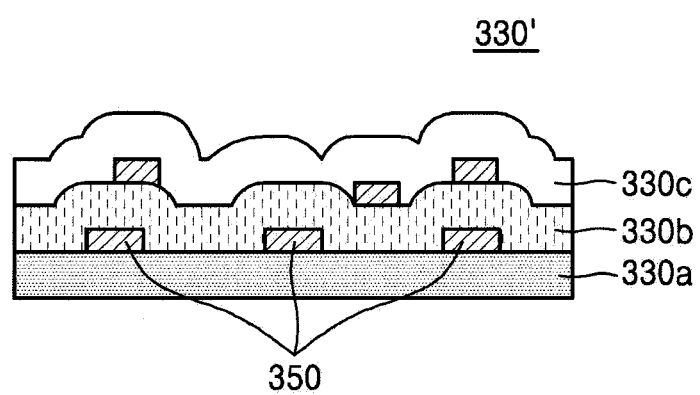
FIG. 6 is a cross-sectional view of an example inorganic layer included in a display device according to another embodiment of the present invention.

FIG. 6 is a cross-sectional view of an example inorganic layer 330' included in a display device according to another embodiment of the present invention. In FIG. 6, like reference numerals to those of FIG. 2 denote like elements, and a repeated description thereof may be omitted.

An inorganic layer 330' may correspond to the first inorganic layer 310 or the second inorganic layer 330 of the display device of FIG. 2, according to one or more embodiments. However, a position of the inorganic layer 330' of FIG. 6 is not limited thereto, and in some embodiments, may be any one of the inorganic layers included in the encapsulating unit (for example, the encapsulating unit 500 of FIG. 2) of one of the display devices described above.

According to one or more embodiments, the inorganic layer 330' may include a multilayer film having first to third layers 330a to 330c that are sequentially laminated. The inorganic layer 300 may include at least one multilayer film (having at least two layers) as already described above with reference to the display device 1000 of FIG. 2.

According to one or more embodiments, as illustrated in FIG. 6, the inorganic layer 330' may be a multilayer film having three layers. The particles 350 may be arranged between the first and second layers 330a and 330b, and may also be arranged between the second and third layers 330b and 330c. The number, size, and position of the particles 350 arranged between each layer may vary.

An upper surface of the second layer 330b may be uneven due to the particles 350 between the first and second layers 330a and 330b, and may project from where the particles 350 are located. Furthermore, an upper surface of the third layer 330c on the second layer 330b may also project from where the particles 350 are located due to the particles 350 between the second and third layers 330b and 330c as well as the particles 350 between the first and second layers 330a and 330b that cause the upper surface of the second layer 330b to have corresponding projecting portions.

Therefore, a projecting or emitting path of light generated from the display unit (such as the display unit 200 of FIG. 5) may be changed due to the projecting portions on the upper surfaces of the second and third layers 330b and 330c. As a result, as light is refracted and dispersed by passing through the second and third layers 330b and 330c of the inorganic layer 330', the display device may ensure a wide viewing angle and improve luminescent efficiency according to one or more embodiments.

In FIG. 6, the inorganic layer 330' includes the first to third layers 330a to 330c, however, in other embodiments, may include a multilayer film comprising four or more such layers. Furthermore, according to some embodiments, the inorganic layer 330' may correspond to one of the inorganic layers in the encapsulating unit (such as the encapsulating unit 500 of FIG. 2) or may correspond to every inorganic layer in the encapsulating unit (such as the encapsulating unit 500 of FIG. 5).

FIGS. 7A through 7D are cross-sectional views sequentially illustrating an example method of manufacturing a display device according to an embodiment of the present invention. In FIGS. 7A through 7D, like reference numerals to those of FIG. 2 denote like elements, and a repeated description thereof may be omitted.

Figure 7A:
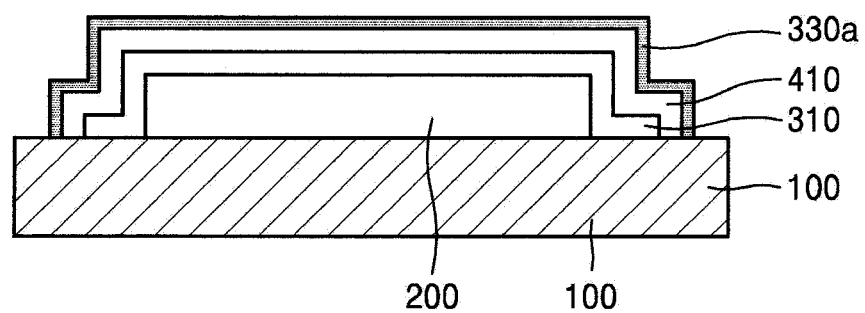
FIGS. 7A through 7D are cross-sectional views sequentially illustrating an example method of manufacturing a display device according to an embodiment of the present invention.

Referring to FIG. 7A, the substrate 100 may be provided and a display unit 200 may be formed on the substrate 100. Next, a first inorganic layer 310 may be formed on the display unit 200, in which the first inorganic layer 310 seals the display unit 200 to protect the display unit 200 from external moisture or oxygen. In order to completely seal the display unit 200, both ends of the first inorganic layer 310 may be formed to be in contact with the substrate 100.

The first inorganic layer 310 may be a single layer or a laminated layer or multilayer including metal oxides or metal nitrides. According to one or more embodiments, the first inorganic layer 310 may include any one or more of SiNx, $Al_2O_3$, $SiO_2$, and $TiO_2$.

According to one or more embodiments, the first inorganic layer 310 may be formed by a chemical vapor deposition (CVD) process. The CVD process may use a gas component at, for example, atmospheric pressure or within a 100 Pa range of a medium vacuum by using a chemical deposition method, and may cause a chemical reaction by providing energy such as heat, plasma, or light, and thus, a thin film may be synthesized and adsorbed on a base material surface. The CVD process may include, for example, a thermal CVD, a plasma CVD, or an optical CVD process. For example, the first inorganic layer 310 may be formed by performing a CVD process according to a chemical reaction, which may be caused by providing reaction gases with energy under a certain pressure condition as would be apparent to one of ordinary skill in the art.

Next, a first organic layer 410 may be formed on the first inorganic layer 310. According to one or more embodiments, the first organic layer 410 may be formed of a polymer, and may be, for example, a single layer or a laminated layer or multilayer formed of any one or more of polyethylene terephthalate (PET), polyimide, polycarbonate (PC), epoxy, polyethylene, and polyacrylate (PAR). According to one or more embodiments, after vaporizing and depositing a liquid monomer, the first organic layer 410 may be formed by radiating ultraviolet rays and performing polymerization to form a polymer. However, the first organic layer 410 is not limited thereto and in other embodiments, may be formed on the first inorganic layer 310 by using various methods as would be apparent to one of ordinary skill in the art.

Next, a first layer 330a of a second inorganic layer 330 may be formed on the first organic layer 410. According to one or more embodiments, the first layer 330a of the second inorganic layer 330 may be formed by using a CVD process.

For example, according to one or more embodiments, the first layer 330a of the second inorganic layer 330 may be formed by performing the same CVD process and under the same conditions as the first inorganic layer 310. For instance, the first layer 330a of the second inorganic layer 330 may be formed by the same pressure, reaction gases, and energy as those of the first inorganic layer 310. However, the first layer 330a of the second inorganic layer 330 is not limited thereto and in other embodiments, may be formed with different materials and under different conditions from those of the first inorganic layer 310.

Figure 7B:
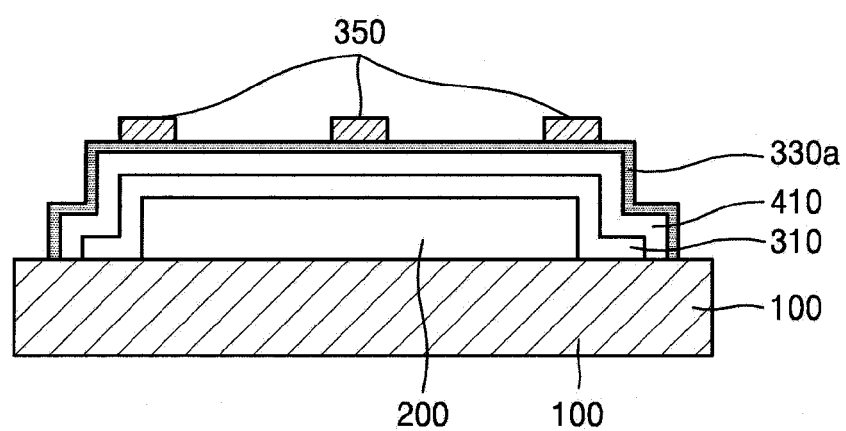

Referring to FIG. 7B, the particles 350 may be formed after the first layer 330a of the second inorganic layer 330 is formed. According to one or more embodiments, the particles 350 may be formed of the same inorganic material as that of the first inorganic layer 310 or the first layer 330a of the second inorganic layer 330.

In more detail, the particles 350 may be an inorganic material including a metal oxide or a metal nitride. According to one or more embodiments, the particles 350 may include any one or more of SiNx, $Al_2O_3$, $SiO_2$, and $TiO_2$.

According to one or more embodiments, the particles 350 may be formed on the first layer 330a by using a CVD process, for example, the same process performed on the first inorganic layer 310 or the first layer 330a of the second inorganic layer 330. In a method of manufacturing a display device according to one or more other embodiments, the particles 350 may be formed by using a CVD process with different materials or under different conditions from those used to form the first inorganic layer 310 or the first layer 330a.

According to one or more embodiments, various reaction gases may be used according to film types and film-forming methods when forming the first inorganic layer 310 and the first layer 330a as would be apparent to one of ordinary skill in the art. In more detail, reaction gases such as $SiH_4$, $O_2$, $N_2O$, or $NH_3$ may be used for the CVD process.

On the other hand, according to one or more embodiments, when forming the particles 350, the CVD process may be performed by not supplying at least one of the reaction gases normally used for thin film forming. For example, when forming the particles 350, at least one of the reaction gases may be left by performing the same CVD process as in the first inorganic layer 310 or the first layer 330a, but with a subset of the reaction gases.

For example, unlike when using the same process as that used to form the first inorganic layer 310 or the first layer 330a, smaller particles 350 may be formed on an upper surface of the first layer 330a when the particles 350 do not fully grow due to the changed process conditions. The particles 350 are illustrated in a fixed rectangular shape in FIG. 7B, but a size or a shape of the particles 350 is not limited thereto. Furthermore, a plurality of smaller particles 350 may be formed on the first layer 330a.

According to one or more embodiments, when forming the particles 350, the power supply may be shut off during the CVD process (when the power supply would normally be on for thin film forming). For example, when forming the particles 350, when the power supply is shut off to the CVD process, the particles 350 may not fully grow, unlike the first inorganic layer 310 and the first layer 330a, even if the CVD process is the same process used with the first inorganic layer 310 or the first layer 330a.

By altering the normal CVD process (e.g., the process used to form the first inorganic layer 310 or the first layer 330a of the second inorganic layer), such as by not supplying one or more of the reaction gases normally supplied, or shutting the power supply off (e.g., shutting the power supply off earlier than with the normal process), an uneven surface, such as the particles 350, may be formed on the first layer 330a.

Figure 7C:
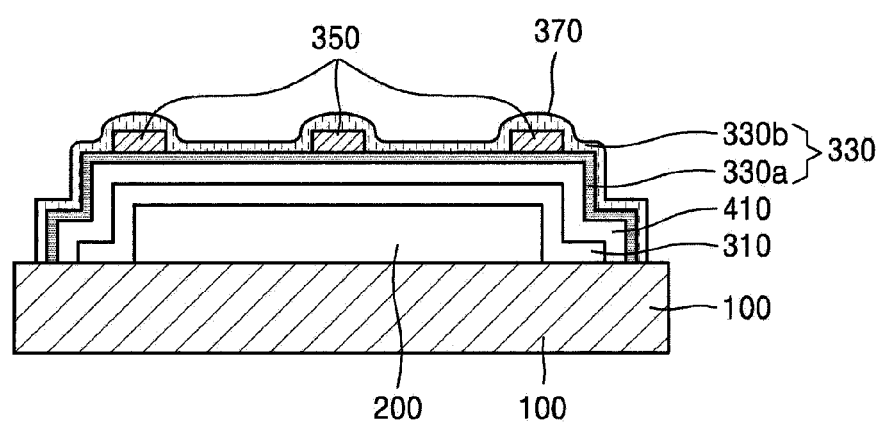

Referring to FIG. 7C, the second layer 330b of the second inorganic layer 330 may be formed on the first layer 330a, in which the particles 350 are arranged, and cover the particles 350. According to one or more embodiments, the second layer 330b may be formed by a CVD process.

For example, according to one or more embodiments, the second layer 330b may be formed by performing the same CVD process and under the same conditions as with the first layer 330a. For instance, the second layer 330b may be formed by the same pressure, reaction gases, and energy as those of the first layer 330a. However, the second layer 330b is not limited thereto and in other embodiments, may be formed using different materials and under different conditions from those of the first layer 330a.

An upper surface of the second layer 330b may have the projecting portions 370 on positions corresponding to where the particles 350 are located when the second layer 330b is formed to cover the particles 350 on the first layer 330a. For example, the second layer 330b formed on the particles 350 may have curves formed by using the particles 350 as seeds, and may include corresponding projecting portions 370 formed thereon.

In one or more embodiments, the projecting portions 370 may change a projecting or emitting path of light that is generated from the display unit 200 since the projecting portions 370 project upward and in a curved fashion from where the particles 350 are located. As a result, according to a method of manufacturing a display device according to one or more embodiments, since light is scattered by the second layer 330b on which the projecting portions 370 are formed, the display device may ensure a wide viewing angle and improve luminescent efficiency.

Furthermore, as described above, the first layer 330a, the particles 350, and the second layer 330b may be formed by using the same or substantially the same or similar CVD process (e.g., shutting off supply of one of the reaction gases normally used or shutting off the power supply earlier than normal), which may be a much simpler technique than comparable processes for forming a curved surface in an encapsulating unit. For example, the first process (to form the first layer 330a), the second process (to form the particles 350), and the third process (to form the second layer 330b) may be continuously performed, such as using a normal CVD process as the first process to form the first layer 330a, adjusting the normal CVD process as described above while forming the first layer 330a to transition into the second process to form the particles 350, and switching back to the normal CVD process while forming the particles 350 to transition into the third process to form the second layer 330b. Accordingly, time and cost may be reduced.

Figure 7D:
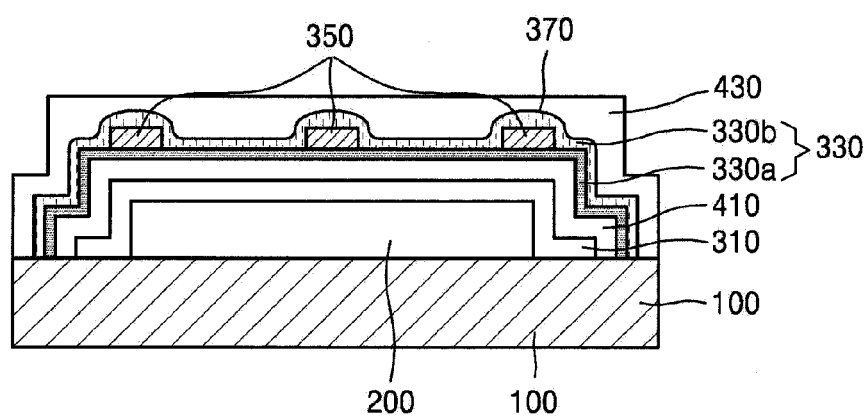

Next, referring to FIG. 7D, a second organic layer 430 may be formed on the second inorganic layer 330. According to one or more embodiments, the second organic layer 430 may be formed of a polymer, and may be, for example, a single layer or a laminated layer or multilayer formed of any one or more of polyethylene terephthalate (PET), polyimide, polycarbonate (PC), epoxy, polyethylene, and polyacrylate (PAR).

According to one or more embodiments, the second organic layer 430 may be formed by performing a physical vapor deposition (PVD) process. In more detail, after vaporizing and depositing a liquid monomer, the second organic layer 430 may be formed by radiating ultraviolet rays and performing polymerization to form a polymer. However, the second organic layer 430 is not limited thereto and in other embodiments, may be formed on the second inorganic layer 330 by using various methods as would be apparent to one of ordinary skill in the art.

The second organic layer 430 may be a planarization film while being formed on the second inorganic layer 330 on the projecting portions 370. For example, as illustrated in FIG. 7D, an upper surface of the second organic layer 430 may be even or flat and without being affected by the projecting portions 370 of the second inorganic layer.

According to one or more embodiments, lateral visibility, WAD, and luminescent efficiency of a display device may be improved by scattering emitted light in an encapsulating unit. Furthermore, time and cost for manufacturing the display device may be reduced because a curved surface scattering light in the encapsulating unit may be formed concurrently (e.g., simultaneously) when an inorganic layer is formed in the encapsulating unit.

It should be understood that the embodiments described herein should be considered in a descriptive sense only and not for purposes of limitation. Furthermore, unless clearly indicated to the contrary, the features or aspects within one embodiment should normally be considered as available for other similar features or aspects in other embodiments.

While one or more embodiments of the present invention have been described with reference to the accompanying figures, it will be understood by those of ordinary skill in the art that various changes in form and details may be made therein without departing from the spirit and scope of the present invention as defined by the following claims, and equivalents thereof.

What is claimed is:

1. A display device comprising:
    a substrate;
    a display unit on the substrate; and
    an encapsulating unit configured to seal the display unit from external moisture or oxygen and comprising an organic layer and an inorganic layer, the inorganic layer comprising:
        a first layer;
        a second layer on the first layer; and
        one or more first particles between the first and second layers,
        wherein an upper surface of the second layer has one or more first projecting portions corresponding to the one or more first particles.

2. The display device of claim 1, wherein
    the one or more first particles comprise two or more first particles, and
    the one or more first projecting portions comprise two or more first projecting portions corresponding to the two or more first particles.

3. A display device comprising:
    a substrate;
    a display unit on the substrate; and
    an encapsulating unit configured to seal the display unit from external moisture or oxygen and comprising an organic layer and an inorganic layer, the inorganic layer comprising:
        a first layer;
        a second layer on the first layer;
        a third layer on the second layer;
        one or more first particles between the first and second layers; and
        one or more second particles between the second and third layers,
        wherein an upper surface of the third layer has second projecting portions corresponding to the first and second particles.

4. The display device of claim 3, wherein an upper surface of the second layer has one or more first projecting portions corresponding to the one or more first particles.

5. The display device of claim 4, wherein the one or more first particles comprises a plurality of first particles, and the one or more first projecting portions comprises a plurality of first projecting portions corresponding to the plurality of first particles.

6. A method of manufacturing a display device, the method comprising:
    forming a display unit on a substrate; and
    sealing the display unit from external moisture or oxygen by forming an encapsulating unit, the forming of the encapsulating unit comprising forming an inorganic layer, the forming of the inorganic layer comprising:
        forming a first layer using a first process;
        forming one or more first particles on an upper surface of the first layer using a second process; and
        forming a second layer on the first layer and the first particles using a third process, wherein the forming of the second layer comprises forming one or more first projecting portions on an upper surface of the second layer corresponding to the one or more first particles.

7. The method of claim 6, wherein the third process is the same process as the first process.

8. The method of claim 7, wherein the second process is a different process from the first and third processes.

9. The method of claim 8, wherein the second process differs in a supply of power from the first and third processes.

10. The method of claim 8, wherein
    the first and third processes comprise supplying a plurality of reaction gases to form the first and second layers, and
    the second process comprises not supplying at least one of the reaction gases.

11. The method of claim 7, wherein the first process, the second process, and the third process are continuously performed.

12. The method of claim 6, wherein the forming of the inorganic layer further comprises forming a third layer on the second layer.

13. The method of claim 12, wherein
    the forming of the inorganic layer further comprises forming one or more second particles on an upper surface of the second layer, and
    the forming of the third layer further comprises forming the third layer on the second particles.

14. The method of claim 6, wherein the forming of the encapsulating unit further comprises forming an organic layer.

* * * * *